United States Patent [19]

Schuyler

[11] Patent Number: 5,319,306

[45] Date of Patent: Jun. 7, 1994

[54] PORTABLE ELECTRICAL LINE TESTER USING AUDIBLE TONES TO INDICATE VOLTAGE

[76] Inventor: Mark Schuyler, Box 7, Somerset, Va. 22972

[21] Appl. No.: 470,448

[22] Filed: Jan. 18, 1990

Related U.S. Application Data

[63] Continuation-in-part of Ser. No. 231,356, Aug. 12, 1988, abandoned.

[51] Int. Cl.[5] .................. G08B 21/00; G08B 23/00
[52] U.S. Cl. .................. 324/133; 324/114; 324/145
[58] Field of Search .............. 324/133; 340/654, 660, 340/691

[56] References Cited

U.S. PATENT DOCUMENTS

| | | | |
|---|---|---|---|
| 3,531,790 | 9/1970 | Staley | 340/660 |
| 3,533,064 | 10/1970 | Perelman | 340/660 |
| 3,930,246 | 12/1975 | Campbell | 340/691 |
| 3,962,630 | 6/1976 | Chaffee | 324/133 |
| 4,004,223 | 1/1977 | Cohen | 324/133 |
| 4,074,244 | 2/1978 | Balderson | 340/691 |
| 4,284,944 | 8/1981 | Iwanaga et al. | 340/636 |
| 4,713,653 | 12/1987 | McDermott | 324/133 |
| 4,725,772 | 2/1988 | Peak | 324/133 |
| 4,736,197 | 4/1988 | Buyak et al. | 324/133 |
| 4,814,933 | 3/1989 | Filter et al. | 324/133 |
| 4,947,110 | 8/1990 | Laass | 324/133 |

Primary Examiner—Kenneth A. Weider
Assistant Examiner—Jose M. Solis
Attorney, Agent, or Firm—Evelyn M. Sommer

[57] ABSTRACT

A compact, hand-held electrical line tester includes a normally-open relay switch which is closed by connection of its relay portion to a line of a predetermined voltage level, and a piezoelectric tone generator, connected in series with the relay switch and a battery, which emits an audible sound to indicate that the tested line is electrified with the predetermined voltage level. The tester circuit can include a plurality of relay switches and/or tone generators for emitting different sounds in response to different line voltages, so that the user can determine the line voltage(s) without having to check a light indicator or read a dial.

4 Claims, 2 Drawing Sheets and 5,319,306

PORTABLE ELECTRICAL LINE TESTER USING AUDIBLE TONES TO INDICATE VOLTAGE

This application is a continuation-in-part of application Ser. No. 231,356 filed Aug. 12, 1988 now abandoned.

FIELD OF THE INVENTION

This invention generally relates to a compact, hand-held, battery-powered electrical line tester, and more particularly, to one which provides an audible indication to the user whether the line tested is electrified with a voltage and, if so, the level of the voltage.

BACKGROUND ART

Electrical line testers are generally known to include the type having a light indicator which is lit when an electrified line is contacted, and another type having a voltage sensing circuit and readout dial indicating the voltage level of the electrified line. The light indicator type is intended to be of low cost and simple construction for use in confirming whether or not a line is electrified with a standard line voltage, e.g., 110 volts AC. However, it has the disadvantage that the light indicator is often difficult to see in bright daylight conditions. Also, the light becomes lit for any voltage over the threshold level, and therefore does not distinguish higher line voltages, such as 220 volts AC. On the other hand, voltage readout testers are quite expensive and bulky, and are not convenient to use and read, particularly in dark, cramped spaces.

Determination of voltage through a line for such devices as high-voltage railroad "third rail" warning detectors are expensive and have complicated electrical schemes. They are intended to be permanently installed. Other detection devices are expensive in that they employ two or more different threshold detecting devices to ascertain different voltages. In addition, the method of warning, once voltage is detected, is complicated. Multiple tone generator circuits which include a pulse train source and digital gates are required to generate different tones.

In general, complicated wiring diagrams characterize the existing voltage detection and multiple tone generating devices. They all require some combination of diodes, rectifiers, amplifiers, display units, annunciators, strobe lights, oscillators, transistors, capacitors, resistors, transducers, pulsators, transient protectors, ground isolations, multiple gates, integrated circuits, anodes, cathodes, electrodes, and emitters or they require the user to manipulate switches to properly operate the device.

Accordingly, it is a principal object of the invention to provide an electrical line tester that can be easily used by one person that is of low cost, of simple construction, small and light enough to be conveniently held in the hand or worn on the belt and carried into small, cramped, dark places, and which provides an unmistakable signal to the user of the voltage level of an electrified line in both bright daylight conditions and dark, cramped conditions. It is a further object that the line tester of the invention distinguishes between different line voltages without the user having to read a dial.

SUMMARY OF THE INVENTION

In accordance with the invention, a portable electrical line tester has a compact housing sized so as to be conveniently held in the hand or worn on the belt and containing a circuit including a normally-open, relay switch having a switch portion which is closed in response to connection of a relay portion of said relay switch with a predetermined line voltage, connecting means for connecting said relay portion to an electrical line to be tested, a battery power source in series with said switch portion of said relay switch, and a piezoelectric element connected to said power source and to said switch portion so that, when said switch portion is closed by connection of said relay portion with a line having the predetermined line voltage, said power source is applied to said piezoelectric element to generate an audible sound corresponding to said predetermined line voltage.

In one preferred embodiment of the invention, the tester circuit includes a plurality of said normally-open relay switches having their relay portions connected in common to said connecting means and their power switch portions connected in parallel between said power source and said piezoelectric element, each switch portion thereof being connected in series through an associated one of a plurality of resistors to said piezoelectric element, wherein a different voltage is applied to said piezoelectric element through a different one or combination of said switch portions and associated resistors in response to each different predetermined line voltage, in order to generate a different sound corresponding to each different predetermined line voltage.

In another embodiment of the invention, the tester circuit includes a plurality of said normally-open relay switches having their relay portions connected in common to said connecting means and each respective switch portion connected between said power source and a respective one of a plurality of piezoelectric elements, wherein a different one or combination of said switch portions is closed and associated piezoelectric elements is activated in response to each different predetermined line voltage, in order to generate a different sound corresponding to each different, predetermined line voltage.

Other objects, features, and advantages of the present invention will become apparent from the following detailed description of the preferred embodiments of the invention in conjunction with the drawings, as follows:

DESCRIPTION OF PREFERRED EMBODIMENTS OF THE INVENTION

Figure 1:
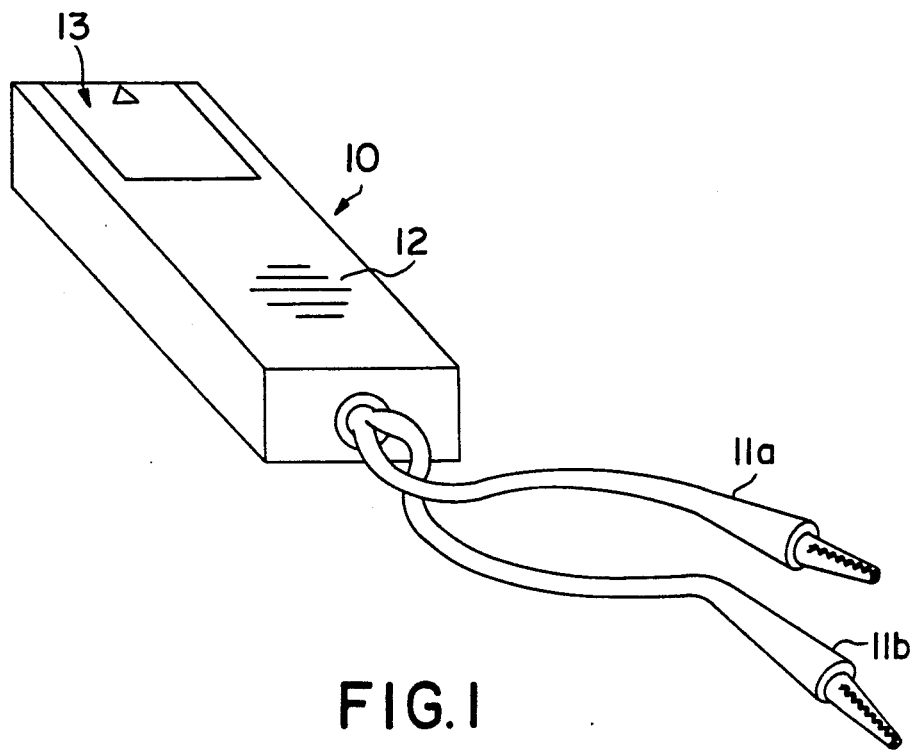
FIG. 1 is an external view of an electrical line tester of the invention.

Referring to FIG. 1, an electical line tester in accordance with the invention includes a compact housing 10, which is sized so as to be conveniently held in the hand or worn on the belt and contains the tester circuit to be described hereinafter, a pair of tester leads 11a, 11b for connection to an electrical line to be tested and to a reference line or ground, a sound emitting portion 12, and a portion 13 housing a battery as a power source for the tester circuit.

The electrical line tester in accordance with the invention is used to generate a sound when the tester leads are connected across a "hot" line relative to the reference line or ground. For example, the tester is used to detect when a household line is electrified with 110 volt AC relative to a ground line or ground. The tester can further be used to generate different sounds indicating "hot" lines of different voltage levels, such as 110 and 220 volts AC. The use of different sounds allows the user to confirm the voltage level of the tested line without having to check a light indicator or visually read a readout dial.

Figure 2:
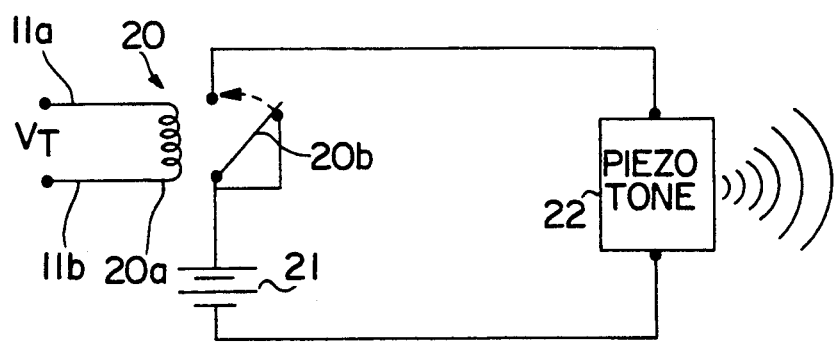
FIG. 2 is a circuit diagram of one embodiment of the line tester in accordance with the invention.

In FIG. 2, a tester circuit of the invention incorporates a relay switch, generally designated by numeral 20 as a double pole, single-throw relay switch, having a relay portion 20a with terminals connected by leads 11a, 11b to a line voltage $V_T$ to be tested, and a switch portion 20b which is normally open and becomes closed only when the line voltage $V_T$ is equal to or greater than a predetermined voltage level, e.g., 110 volts. The switch portion 20b is connected in a series circuit with a power source 21, such as a 9 volt battery, and a piezoelectric crystal 22 which emits a sound when the battery voltage is applied to its terminals upon the closing of switch portion 20b in response to contact with an electrified line having the predetermined voltage level. Thus, the user will hear a beep sound when any "hot" line of 110 volts or higher (i.e., 220 volts) is contacted by the test leads relative to the ground line.

Figure 3:
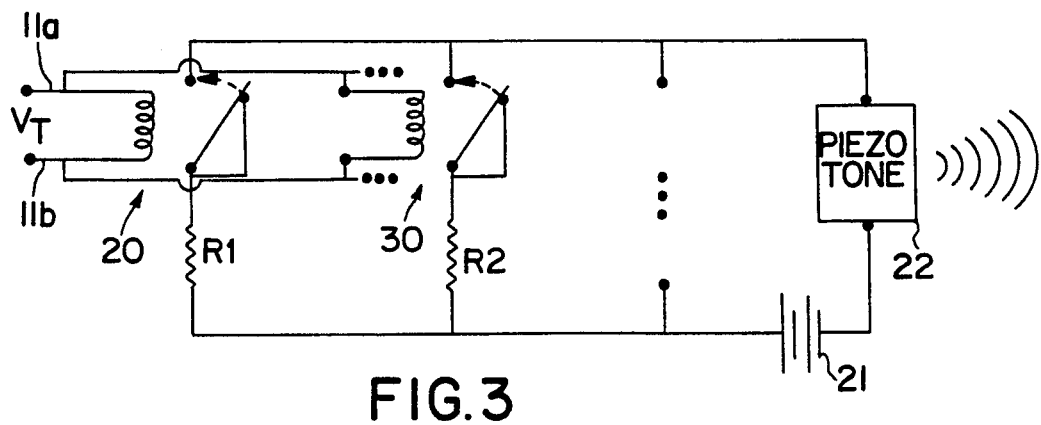
FIG. 3 is a circuit diagram of another embodiment of the line tester.

Another tester circuit embodying the invention is shown in FIG. 3 having a plurality of relay switches 20, 30, etc. connected in common through the leads 11a, 11b to the line voltage $V_T$ to be tested. The switch portions of the relay switches 20, 30 are connected in a parallel circuit to the battery 21 and the piezoelectric crystal 22. Each relay switch is configured to close in response to a different voltage level, e.g., switch 20 closes when the line voltage $V_T$ is 110 volts or higher, and switch 30 closes when the line voltage $V_T$ is 200 volts or higher. Each switch portion is also connected in series to an associated resistor R1, R2, etc. The voltage level applied to the piezoelectric crystal 22 will be different depending upon whether one or a combination of the parallel legs of the circuit are closed. Accordingly, if $V_T$ is 110 volts, the relay switch 20 will close and a current will flow through resistor R1, and if $V_T$ is 220 volts, both relay switches 20 and 30 will close, and currents will flow through the resistors R1 and R2. The piezoelectric crystal will thus emit different sounds in response to the different currents and net resistance in each case. Additional relay switches may be used to cause other sounds indicating other line voltage levels.

Figure 4:
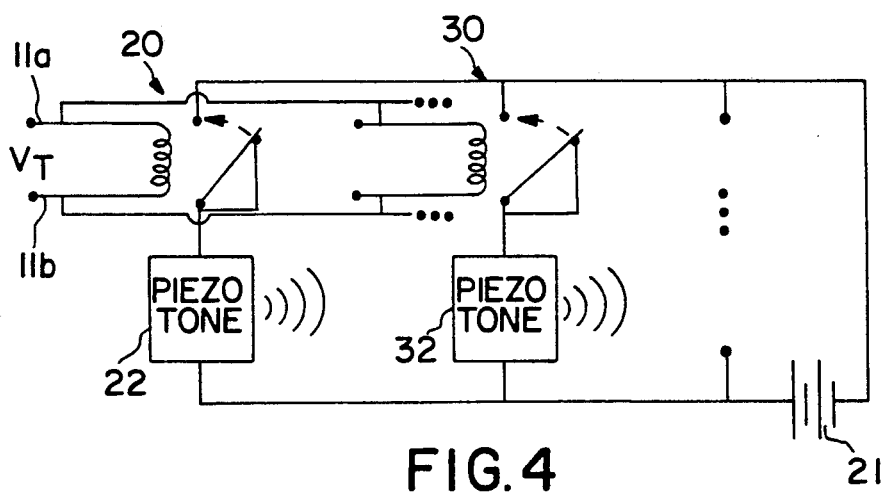
FIG. 4 is a circuit diagram of a further embodiment of the line tester.

A further embodiment shown in FIG. 4 has a plurality of relay switches 20, 30, etc. connected in common through the leads 11a, 11b to the line voltage $V_T$ to be tested. Each switch portion of the relay switches 20, 30 is connected in series to an associated piezoelectric crystal 22, 32, etc. Each relay switch will close in response to a different voltage level, thereby causing one or a combination of piezoelectric crystals 20, 30, etc. to emit a sound or a combination of sounds. Accordingly, if $V_T$ is 110 volts, the relay switch 20 will close and crystal 22 will emit one sound, and if $V_T$ is 220 volts, both relay switches 20 and 30 will close and crystals 22 and 32 will emit a combined sound. Additional relay switches and tone-emitting piezoelectric crystals may be used to cause other sounds indicating other line voltage levels.

From the foregoing description, it will be recognized by those skilled in the art that the present invention provides a simple, compact, hand-held electrical line tester which is inexpensive to make, is convenient to carry, will fit into the limited spaces encountered on the job, and which provides an audible sound when a "hot" line is tested relative to a reference line or ground. Moreover, the tester is capable of emitting different sounds to indicate different voltage levels, such as different standard single-phase or two phase AC voltage lines. Since the voltage level of the tested line is indicated by an audible sound or different sounds, the user can determine the line voltage(s) without having to check a light indicator or read a readout dial.

Although the invention has been described with reference to certain preferred embodiments, it will be appreciated that other types of voltage-detecting switch elements, tone generators, or other circuit variations may be devised. All such modifications and variations are nevertheless considered to be within the spirit and scope of the invention as defined in the claims appended hereto.

While the invention has been described as including a normally-open relay switch, it is within the skill of the art to provide instead a normally closed relay switch, wherein the switch portion moved to the open position closes a circuit to the piezoelectric element and an audible sound is generated when no current is passing through the relay portion.

In the same manner, single pole relay switches can be substituted for the double pole relay switches.

I claim:

1. An electrical line tester comprising:
   a pair of tester leads connectable respectively to an electrical line to be tested and a reference line;
   a plurality of tester segments arranged in parallel, each including a respective relay switch and a resistor connected in series therewith;
   a power source and a tone generator connected across said plurality of tester segments of relay switches and associated resistors,
   wherein the relay switches of said tester segments have respective relay portions which are connected in common through said pair of tester leads to the electrical and reference lines and which are operable at different relay values such that they are progressively closed in response to progressively higher predetermined line voltages, and wherein the resistors of said tester segments have selected resistance values such that different net resistance values are applied to said tone generator and said tone generator emits different sounds upon connection of said tester leads to different, progressively higher line voltages.

2. A portable electrical line tester according to claim 1, wherein said relay switches are normally open, double-pole, single throw relay switches.

3. An electrical line tester comprising:
   a pair of tester leads connectable respectively to an electrical line to be tested and a reference line;
   a plurality of tester segments arranged in parallel, each including a respective relay switch and a tone generator connected in series therewith;
   a power source connected across said plurality of tester segments of relay switches and associated tone generators, wherein the relay switches of said tester segments have respective relay portions which are connected in common through said pair of tester leads to the electrical and reference lines and which are operable at different relay values such that they are progressively closed in response to progressively higher predetermined line voltages, and wherein the tone generators of said tester segments emit different respective tones such that different overall sounds are emitted by the tone generators upon connection of said tester leads to different, progressively higher line voltages.

4. A portable electrical line tester according to claim 3, wherein said relay switches are normally open, double-pole, single throw relay switches.

* * * * *